United States Patent
Bell et al.

(10) Patent No.: US 11,789,519 B2
(45) Date of Patent: Oct. 17, 2023

(54) MEMORY DEVICE SENSORS

(71) Applicant: Micron Technology, Inc., Boise, ID (US)

(72) Inventors: Debra M. Bell, Boise, ID (US); Roya Baghi, Boise, ID (US); Erica M. Gove, Boise, ID (US); Zahra Hosseinimakarem, Boise, ID (US); Cheryl M. O'Donnell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/892,629

(22) Filed: Aug. 22, 2022

(65) Prior Publication Data

US 2022/0404892 A1 Dec. 22, 2022

Related U.S. Application Data (63) Continuation of application No. 16/707,488, filed on Dec. 9, 2019, now Pat. No. 11,435,811.

(51) Int. Cl.
  *G06F 1/3234* (2019.01)
  *G11C 16/26* (2006.01)
  *G11C 11/56* (2006.01)

(52) U.S. Cl.
  CPC ........ *G06F 1/3275* (2013.01); *G11C 11/5642* (2013.01); *G11C 16/26* (2013.01)

(58) Field of Classification Search
  CPC .... G09F 1/3275; G11C 11/5642; G11C 16/26
  See application file for complete search history.

(56) References Cited

U.S. PATENT DOCUMENTS

| | | | |
|---|---|---|---|
| 5,532,968 A | 7/1996 | Lee | |
| 5,784,328 A | 7/1998 | Irrinki et al. | |
| 6,453,218 B1 | 9/2002 | Vergis | |
| 7,272,063 B1 | 9/2007 | Egerer et al. | |
| 9,809,085 B1 * | 11/2017 | Pierce | B60H 1/00985 |

(Continued)

FOREIGN PATENT DOCUMENTS

| | | |
|---|---|---|
| EP | 0851427 | 7/1999 |
| KR | 10-2012-0100826 | 9/2012 |
| KR | 10-2018-0035692 | 4/2018 |

OTHER PUBLICATIONS

International Search Report and Written Opinion from related international application No. PCT/US2020/058468, dated Apr. 21, 2021, 11 pages.

*Primary Examiner* — Henry Tsai
*Assistant Examiner* — Aurangzeb Hassan
(74) *Attorney, Agent, or Firm* — Brooks, Cameron & Huebsch, PLLC (57) ABSTRACT

Systems, apparatuses, and methods related to using memory device sensors are described. Some memory system or device types include sensors embedded in their circuitry. For instance, a device can be coupled to a memory device with an embedded sensor. The memory device can transmit the data generated by the embedded sensor using a sensor output coupled to the device. The memory device may generate, based at least in part on a characteristic of a memory device, a signal from a sensor embedded in the memory device and transmit the signal generated by the sensor from the memory device to another device coupled to the memory device.

20 Claims, 4 Drawing Sheets

(56) References Cited

U.S. PATENT DOCUMENTS

| | | |
|---|---|---|
| 2005/0036380 A1 | 2/2005 | Su |
| 2006/0146629 A1 | 7/2006 | Lee |
| 2008/0137460 A1 | 6/2008 | Incamati et al. |
| 2009/0323400 A1 | 12/2009 | Shinozaki |
| 2010/0027343 A1 | 2/2010 | Teggatz et al. |
| 2010/0284209 A1 | 11/2010 | Kim et al. |
| 2011/0149094 A1* | 6/2011 | Chen .................. H04N 5/23261 |
| | | 348/E5.022 |
| 2012/0099391 A1 | 4/2012 | Park |
| 2014/0260704 A1* | 9/2014 | Lloyd .................. B81C 1/0023 |
| | | 73/865.8 |
| 2014/0361753 A1 | 12/2014 | Lovett |
| 2015/0155039 A1 | 6/2015 | Tran et al. |
| 2016/0272112 A1* | 9/2016 | DeGrazia ................. B60Q 9/00 |
| 2016/0286169 A1 | 9/2016 | Sannala |
| 2017/0352406 A1 | 12/2017 | Querbach et al. |
| 2018/0220073 A1* | 8/2018 | Keal .................. H04N 5/23258 |
| 2018/0277173 A1 | 9/2018 | Takizawa et al. |
| 2018/0343550 A1 | 11/2018 | Murai |
| 2019/0361625 A1* | 11/2019 | Eliash .................. G06F 3/0632 |
| 2021/0349471 A1* | 11/2021 | Ross .................... G05D 1/0274 |

* cited by examiner

MEMORY DEVICE SENSORS

PRIORITY INFORMATION

This application is a Continuation of U.S. application Ser. No. 16/707,488, filed Dec. 9, 2019, the contents of which are herein incorporated by reference.

TECHNICAL FIELD

The present disclosure relates generally to semiconductor memory and methods, and more particularly, to apparatuses, systems, and methods for memory device sensors.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to another device (e.g., a computing device, a processing resource, etc.) to store data, commands, and/or instructions for use by the device while the computer or electronic system is operating. For example, data, commands, and/or instructions can be transferred between the other device and the memory device(s) during operation of a computing or other electronic system.

DETAILED DESCRIPTION

Systems, apparatuses, and methods related to using memory device sensors are described. Some memory system or device types include sensors embedded in their circuitry. For instance, a device can be coupled to a memory device with an embedded sensor. The memory device can transmit the data generated by the embedded sensor using a sensor output coupled to the device. For instance, the memory device may generate, based at least in part on a characteristic of a memory device, a signal from a sensor embedded in the memory device and transmit the signal generated by the sensor from the memory device to another device coupled to the memory device.

Utilizing sensors embedded in memory devices to obtain information generated by the embedded sensor can conserve resources (e.g., space, money, power, etc.) by removing the need to include hardware for an external sensor. For instance, another device can be coupled to a memory device including an embedded sensor. The memory device can transmit the signal generated by the embedded sensor using a dedicated sensor output coupled to the other device.

A computing system including memory devices can include one or more different memory media types which can be used to store (e.g., write) data in a computing system. Such data can be transferred between the computing system and the memory system. The data stored in the memory media of the memory device can be important or even critical to operation of the computing system and/or another device connected to the memory device. There are various types of memory devices including memory media. Some examples of memory media include non-volatile memory and volatile memory.

Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and Storage Class Memory (SCM) that can include resistance variable memory, such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory. Volatile memory can require power to maintain its data (e.g., error data, etc.) and includes random-access memory (RAM), dynamic random access memory (DRAM), and static random access memory (SRAM), among others. Some types of memory devices can include sensors embedded in the circuitry of the memory device.

For example, DRAM can include one or more sensors (e.g., a temperature sensor) that are embedded in circuitry. The embedded sensors can be programmable to generate a signal. The signal can represent sensor data and the memory device (e.g., including DRAM) can receive the signals and store the data associated with the sensors (e.g., sensor data). The signal can represent data related to an environment where the DRAM is located and/or related to another device that is coupled to the DRAM. Computing devices can frequently include DRAM as memory media. As other devices such as, wireless communication devices, mobile devices, semi-autonomous vehicles, fully autonomous vehicles, Internet of Things (IoT) devices, mobile artificial intelligence systems, etc. become more prevalent, sensors and other devices related to computing systems are also increasingly needed to generate information about the surroundings of the computing device. As such, there is a growing need for information gathered by sensors coupled to computing devices.

In some approaches, external sensors can be coupled to a host and transmit a signal including sensor data to a memory device coupled to another device that can be included in a host. This approach can provide a signal generated from the sensor to the host. This approach can be slow, costly, and the sensors can occupy space that may not be readily available, consume excess power, and/or otherwise waste resources of the computing system (e.g., host).

Hosts can include processors, a central processing unit (CPU), and/or be another device connected to the memory device. Such hosts include edge computing devices, computing devices within a mobile device, computing devices within vehicles (e.g., autonomous or semi-autonomous vehicles, etc.) and can use memory devices such as DRAM to execute applications and may benefit from the use of sensors. In some examples herein, memory devices including memory media such as DRAM may include sensors on-board (e.g., embedded in circuitry of the memory device). For example, a vehicle can include a device (e.g., a computing device, a processor, a CPU, etc.) to execute instructions sored in a memory device coupled to the device within the vehicle. The sensors may be intermittently or consistently generating signals including sensor data to be written (e.g., stored) in the DRAM, however, end application access to the sensor data stored in DRAM is not always possible or efficient. As more devices (e.g., edge computing devices, vehicles, etc.) utilize DRAM, and storage capability of memory systems increase, the volume of sensor data generated by embedded sensors increases, and the effects of the inability to access sensor data stored in DRAM become more pronounced. These effects can be further exacerbated by the limitations of some approaches to read and interpret sensor data from external sensors such that the contents can be effective, especially as the amount of sensor data stored in memory systems and the speed at which sensor data retrieval is expected.

In contrast, embodiments herein are directed to enabling end application, user applications, and/or host applications, access to sensors embedded in memory devices such that the devices coupled to the memory device can conserve resources by refraining from the installation of external sensors thus saving power, unnecessary hardware, cost, etc. Hosts can take advantage of already existing embedded sensors included in memory devices coupled to the host. For example, in a context of mobile devices and/or partially or fully autonomous vehicles, decisions related to signals received from sensors may require end-user access such that actions can be taken quickly, efficiently, or otherwise interpreted. Enabling the use of sensors already existing on DRAM can increase the availability of such sensor data from sensors.

In another embodiment, sensors described herein can be located and/or exist near and/or on a scribe line in semiconductor memory devices. A scribe line can be located on a semiconductor wafer between dies such that the dies can be separated. In some examples, sensors are integrated on a semiconductor wafer near and/or on the scribe line during manufacturing. Enabling the use of these integrated (e.g., embedded) sensors post-manufacturing can increase the availability of data collected by the sensors without the need of extra and/or external hardware.

Embodiments herein describe another device coupled to a memory device that can be configured by a controller e.g., a processor, control circuitry, hardware, firmware, and/or software and a number of memory devices each including control circuitry. The controller can include a command decoder to output a value to another device included on the host. As used herein, the term "value" refers to an output from a sensor embedded in a memory device. Some examples of values can include a temperature value e.g., a temperature in Fahrenheit, Celsius, Kelvin, or any other unit used to measure thermodynamic temperature. The temperature value can be transmitted as an encoded 8-bit binary string. Another examples of a value can be a unit of time (e.g., microseconds (µs), seconds, minutes, etc.), or a quantity of detection events. A detection event can be a quantity of motion events detected by a motion sensor embedded in a memory device and a motion value and/or a motion sensor value can be a quantity of motion events detected.

The output can be transmitted from the memory device using a sensor output. As used herein, the term "sensor output" refers to an output component that is configured to transfer sensor data (e.g., a value) from an embedded sensor to another device and/or a host. For example, a sensor output can be separate from a data output generally included on a bus. The sensor output can be used to transmit an indication about the signal that represents sensor data to another device and/or the host. The sensor output can be dedicated to the sensor such that it is configured to transmit the signal that represents sensor data and/or an indication to the other device.

In some examples, a sensor output described herein can be a value generated as an average of more than one embedded sensor. In some examples, the sensor output can be a weighted average of more than one embedded sensor where the weight is based on the location of the embedded sensor relative to the area where the sensor is generating a signal that represent sensor data. For example, more than one embedded temperature sensor can be located in various positions on a host to monitor the temperature of the interior of the host. The temperature value generated by an embedded sensor located nearest to the interior sensor can be weighted higher than a different embedded sensor generating a signal representing temperature data from farther away from the interior of the host.

In another embodiment described herein, memory devices including memory media such as DRAM having an embedded sensor can be configured to transmit a signal that represents sensor data from the embedded sensor to another device coupled to the memory device using standard I/O lines included in a bus. For example, a controller (e.g., a command decoder) can receive a command (e.g., a multi-purpose register read command), and the memory device can be configured to map each embedded sensor output to a corresponding multi-purpose register. In this example, existing bandwidth of the memory device can be used to conserve the need for a dedicated sensor output.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, designators such as "N," "M", "P", etc., particularly with respect to reference numerals in the drawings, indicate that a number of the particular feature so designated can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of memory devices) can refer to one or more memory devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context, and, unless stated otherwise, can include a wireless connection. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures can be identified by the use of similar digits. For example, 106 can reference element "06" in FIG. 1, and a similar element can be referenced as 206 in FIG. 2. A group or plurality of similar elements or components can generally be referred to herein with a single element number. For example, a plurality of reference elements 230-1, . . . , 230-P (e.g., 230-1 to 230-P) can be referred to generally as 230. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Figure 1:
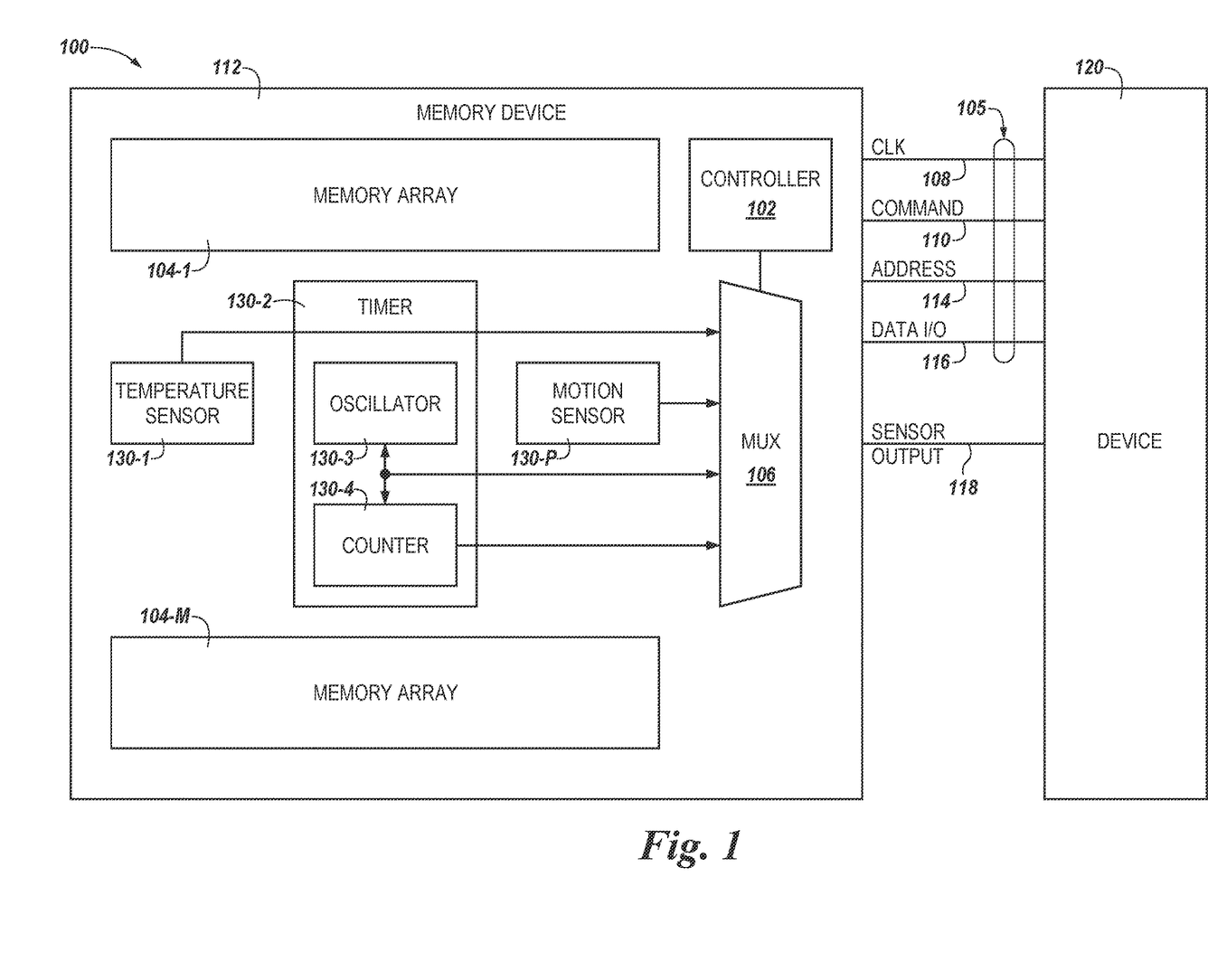
FIG. 1 is a functional block diagram of an apparatus in the form of a computing system including memory device sensors in accordance with a number of embodiments of the present disclosure.

FIG. 1 is a functional block diagram of an apparatus in the form of a computing system 100 including memory device sensors in accordance with a number of embodiments of the present disclosure. As used herein, an "apparatus" can refer to, but is not limited to, any of a variety of structures or combinations of structures, such as a circuit or circuitry, a die or dice, a module or modules, another device or devices, or a system or systems, for example. The computing system 100 can include memory device 112. The memory device 112 can include memory array 104-1 and memory array 104-M which may be collectively referred to herein as the memory array 104. The memory device 112 can include a controller 102 coupled to a multiplexer (MUX) 106. The MUX 106 can be coupled to one or more sensors embedded in circuitry of the memory device 112. For example, the MUX 106 can be coupled to a temperature sensor 130-1, a timer 130-2 (e.g., for self-refresh control), an oscillator 130-3, a counter 130-4, and/or a motion sensor 130-P, which may be collectively referred to as the sensor or the sensors 130. A motion sensor can include integrated orientation sensors such as accelerometers and/or gyroscopes (e.g., microelectromechanical system gyroscope). Although specific types of sensors are mentioned herein, embodiments are not so limited and other sensors can be used (e.g., a pressure sensor and/or a random number generator).

The memory device 112 can include volatile or non-volatile memory. For example, the memory media of the memory device 112 can be volatile memory media such as DRAM. DRAM can include a plurality of sensors which can be at least one of a temperature sensor, a motion sensor, an oscillator, a timer, or a combination thereof. The memory device 112 can be coupled to another device 120 via a bus 105. The bus 105 can include a clock line (CLK) 108, a command line 110 to transmit commands, an address line 114 to determine where commands should be sent, and a data input/output (data I/O) 116. The other device 120 can be a CPU, a graphics processing unit (GPU), an application specific integrated circuit (ASIC), an edge computing device, etc. The device 120 can be a host (e.g., a processor) and/or included as part of a host (e.g., a computing device within another device).

For example, a host can be a host system (e.g., a computing system within a larger device) such as a computing device within a wireless connected device, a computing device within a personal laptop computer, a computing device within a vehicle, a CPU and/or processor within a desktop computer, a computing device within a digital camera, a computing device within a mobile telephone, an internet-of-things (IoT) enabled device, or a computing device within a memory card reader, a computing device within graphics processing unit (e.g., a video card), among various other types of hosts. As used herein an "IoT enabled device" can refer to devices embedded with electronics, software, sensors, actuators, and/or network connectivity which enable such devices to connect to a network and/or exchange data. Examples of IoT enabled devices include mobile phones, smart phones, tablets, phablets, computing devices, implantable devices, vehicles, home appliances, smart home devices, monitoring devices, wearable devices, devices enabling intelligent shopping systems, among other cyber-physical systems.

The host and/or the other device 120 can include a system motherboard and/or backplane and can include a number of memory access devices, e.g., a number of processing resources (e.g., one or more processors, microprocessors, or some other type of controlling circuitry). One of ordinary skill in the art will appreciate that "a processor" can intend one or more processors, such as a parallel processing system, a number of coprocessors, etc. The device 120 can be coupled to memory device 112 by the bus 105.

The controller 102 can include a command decoder which can receive commands from the command line 110 of the bus 105. The command to read data from a sensor 130 can be received by the controller 102. The command can be a mode register type command from the other device 120 which can include information related to which sensor needs to output a signal representing sensor data using the sensor output 118. The MUX can be a device that selects between analog and digital input signals received from selection pins and forward the signal to the sensor output 118.

As mentioned, the computing system 100 includes a sensor 130 embedded in circuitry the memory device 112. The sensor 130 can be configured to collect data related to the other device 120 connected to the memory device 112. For example, the other device 120 can be a part of and/or coupled to a host. The sensor 130 can be embedded in the memory device 112 such as including memory such as DRAM and collect data corresponding to an environment of the other device 120. Said differently, the embedded sensor 130 can be a temperature sensor 130-1 which can generate a signal representing sensor data (e.g., a particular temperature value) in the form of a temperature of the host and/or an environment of the host.

The memory device 112 can be configured to transmit the sensor 130 signal that represents sensor data to the other device 120 using the sensor output 118. For example, the sensor output 118 coupled can be coupled to one or more of the sensors 130 and to the other device 120 to transmit the signal that represents sensor data collected by the sensor 130 to the other device 120. The sensor output can be dedicated to the sensor embedded in the memory device 112. In this way, embedded sensors 130 can be accessible by end applications (e.g., users, hosts, etc.) to provide sensor generated data.

In some embodiments, the MUX 106 can receive signals that represent sensor data from multiple sensors 130 responsive to receiving a command from the controller 106. For example, the controller 106 can receive a request from the other device 120 via the bus 105 to read sensor data from one or more sensors 130. Responsive to receiving the request, the controller 102 can transmit a command to the MUX 106 to select and forward signals that represent sensor data from the temperature sensor 130-1 and the motion sensor 130-P, where the motion sensor 130-P and the temperature sensor 130-1 are both embedded in circuitry of the of the memory device 112. The MUX 106 can transmit the signal that represents sensor data from the temperature sensor 130-1 and the motion sensor 130-P to the other device 120 via the sensor output 118.

Figure 2:
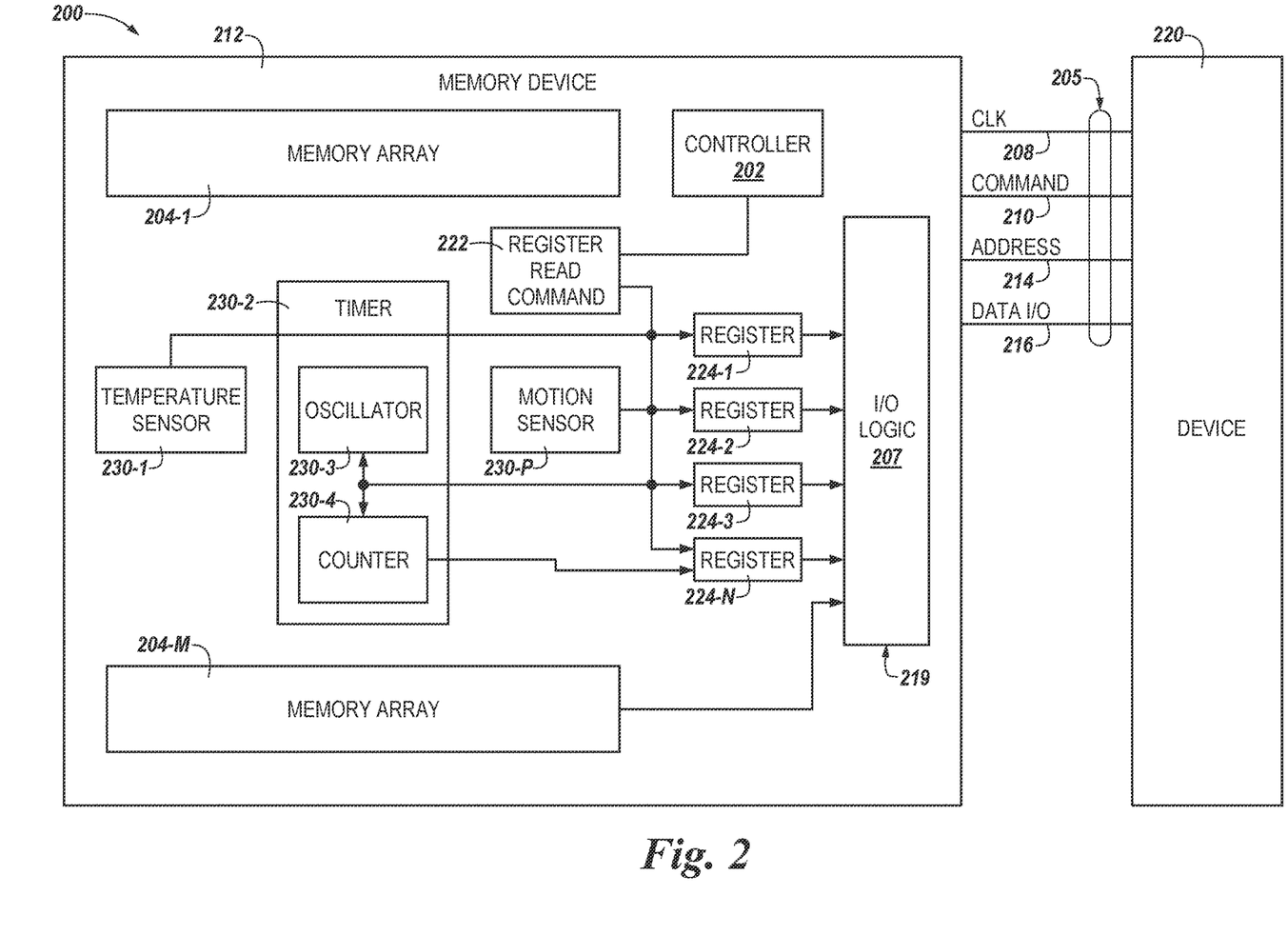
FIG. 2 is a functional block diagram in the form of a computing system including device sensors in accordance with a number of embodiments of the present disclosure.

FIG. 2 is a functional block diagram in the form of a computing system 200 including memory device sensors 230 in accordance with a number of embodiments of the present disclosure. The computing system 200 can include memory device 212 and be analogous to the memory device 112 of FIG. 1. The memory device 212 can include memory array 204-1 and memory array 204-M which may be collectively referred to herein as the memory array 204 and be analogous to the memory array 104 of FIG. 1.

The memory device 212 can include controller 202 which can be analogous to controller 102 of FIG. 1. The controller 202 can be coupled to registers 224-1, 224-2, 224-3, and 224-N and be collectively referred to herein as registers 224. The registers 224 can each be coupled to one or more sensors embedded in circuitry of the memory device 212. For example, the register 224-1 can be coupled to a temperature sensor 230-1, the register 224-2 can be coupled to a motion sensor 230-P, the register 224-3 and 224-N can be coupled to a timer 230-2 via an oscillator 230-3 and/or a counter 230-4, which may be collectively referred to as the sensor or the sensors 230. Although specific types of sensors are mentioned herein, embodiments are not so limited and other sensors can be used (e.g., a pressure sensor and/or a random number generator).

The memory device 212 can be coupled to device 220 via a bus 205. The bus 205 can include a clock line (CLK) 208, a command line 210 to transmit commands, an address line 214 to determine where commands should be sent, and a data input/output (data I/O) 216. The other device 220 can be a CPU, a graphics processing unit (GPU), an application specific integrated circuit (ASIC), an edge computing device, etc. The other device 220 can be included as part of a host (not illustrated as to not obscure examples of the disclosure).

The bus 205 can be coupled to an input/output logic (IO logic) 219. The IO logic 219 can be a communication between the memory device 212 and the other device 220. The I/O logic 219 can include hardware to perform input and output operations for the memory device 212. The I/O logic 219 can receive information from the imbedded sensors 230 and transmit them to the other device 220 via the bus 205.

FIG. 2 illustrates an example of a device 220 and memory device 212 coupled to the other device 220. The memory device 212 includes a plurality of sensors 230 embedded in the memory device 212, and a plurality of registers 224 each respectively coupled to one of the plurality of sensors 230, the controller 202 (e.g., a command decode) to transmit commands to read one or more of the plurality of registers, and a data output (Data/IO) 216 coupled to the plurality of registers 224 (e.g., via the IO logic 219) to transmit the sensor data from the plurality of registers 224 to the other device 220.

The signal that represents sensor data transmitted from the sensors 230 to respective registers 224 can be sensor data of an operation of the sensor 230. For example, the temperature sensor 230-1 can generate a temperature value and transmit a signal representing a temperature value to the register 224-1, the embedded timer 230-2 can include an oscillator 230-3 and/or a counter 230-4 which can transmit a signal representing sensor data to register 224-3 and/or 224-N, the embedded motion sensor 230-P can transmit a signal that represents motion sensor data to the register 224-2.

The embedded timer can include the oscillator 230-3 which can produce a periodic signal to transmit to the register 224-3 and/or to the counter 230-4. The counter 230-4 can (independently or concurrently with the oscillator 230-3) transmit a quantity of incidences of data collected by one or more of the sensors 230. Said differently, the oscillator 230-3 can work with the counter 230-4 to periodically generate a signal which can report a quantity of signals generated from any of the sensors 230. In contrast, the oscillator 230-3 and the counter 230-4 can operate independently to transmit respective signals that represent sensor data to respective registers.

In some embodiments, the controller 202 can configure the sensors 230 to generate signals that represent sensor data based on parameters. For example, the controller 202 can configure the sensors 230 to generate signals that represent sensor data to the respective registers 224 when the other device 220 is located in a particular environment. The controller 202 can generate a register read command 222 to read the sensor data stored in the respective registers and the I/O logic 219 can transmit the sensor data from the registers 224 to the other device 220.

The environment can be a location of the other device 220 (e.g., a location of the host coupled to the other device). The controller 202 can receive an indication from the other device 220 related to the environment, and the controller 202 can configure the sensors 230 to generate signals that represent sensor data about the environment. For example, the controller 202 can receive an indication that the other device 220 (e.g., a host coupled to the other device 220) is located in an environment. The controller 202 can configure the temperature sensor 230-1 to generate a temperature value (e.g., an encoded 8-bit binary string) and transmit the temperature value to the register 224-1. Responsive to a register read command 222 transmitted from the controller 202, the I/O logic 219 can transmit the signal that represents sensor data from the register 224-1 including the temperature value to the other device 220. Said differently, the I/O logic 219 can transmit the values related to the respective operations of the plurality of sensors 230 to the other device 220. Using these methods, the temperature value generated by the embedded temperature sensor 230-1 can be accessible to the other device 220 and/or the host/user.

In some embodiments, the embedded timer 230-2 (using an embedded oscillator 203-3 and/or an embedded counter 230-4) can produce a timer output with a fixed period such as In other embodiments, the timer output can be a flag, where the controller 202 is configured to generate a register read command 222 when a quantity of seconds have elapsed. The controller 202 can program the memory device 212 to generate sensor outputs to the respective registers 224 based on the quantity of seconds that have elapsed.

As mentioned, the motion sensor 230-P can be embedded in the circuitry of the memory device 212 and can detect a change in motion within an environment. For example, the environment can be a location of the other device 220 (e.g., a location of the host coupled to the other device). The controller 202 can receive an indication from the other device 220 related to the environment and the controller 202 can configure the sensors 230 to generate signals that represent sensor data about the environment. For example, the controller 202 can receive an indication that the other device 220 (e.g., a host coupled to the other device 220) is located in an environment. The controller 202 can configure the motion sensor 230-P to generate a flag if motion is detected in the environment. Responsive to a register read command 222 transmitted from the controller 202, the I/O logic 219 can transmit the sensor data from the register 224-2 including the motion sensor flag to the other device 220.

In some embodiments, multiple embedded sensors 230 can be used in combination to provide information to the host/user via the other device 220. For example, the other device 220 can be coupled to an IoT device (e.g., a host) and the IoT device can initiate an operation responsive to transmission of the signals that represent sensor data (e.g., from one or more of the sensors 230) from the plurality of registers 224 to the other device 220. The IoT device can include the other device 220 and can make decisions based on the received sensor data. For example, the IoT device may be a mobile phone, and the other device 220 coupled to the mobile phone may receive a temperature value from the temperature sensor 230-1, and the motion sensor 230-P embedded in the memory device 212 of the mobile phone. Based on the receipt of the temperature value and the motion sensor value, the other device 220 may initiate the mobile phone to change an operation (e.g., switch from "on" to "off"). Using these methods, hosts/users can gain access to sensor data generated by the embedded sensors and avoid the need for external sensor installations.

Figure 3:
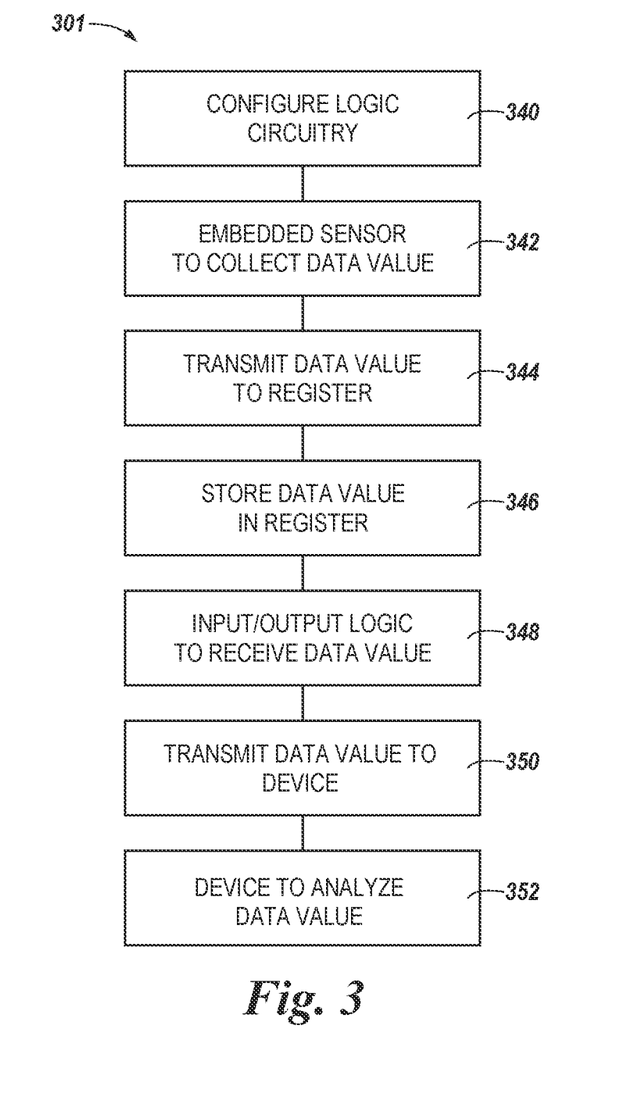
FIG. 3 is flow diagram including examples of memory device sensors in accordance with a number of embodiments of the present disclosure.

FIG. 3 is flow diagram including an example of memory device sensors in accordance with a number of embodiments of the present disclosure. The flow diagram 301 of FIG. 3 describes a memory device (e.g., the memory device 112 of FIG. 1) programming, via a controller (e.g., the controller 102 of FIG. 1), sensors (e.g., the sensors 130 of FIG. 1) embedded in circuitry of the memory device, to generate signals that represent sensor data about a host coupled to another device (e.g., the device 120 of FIG. 1). At block 340 the memory device can configure, via the controller, the sensors embedded in the circuitry of the memory device to generate signals that represent sensor data to be externally accessible to another device. For example, the memory device can be configured to generate signals that represent sensor data from the embedded sensors. In some embodiments, the memory device can be configured to generate the signal that represents sensor data from the respective embedded sensors at predetermined intervals, when the other device is operating, and/or when the sensors detect a value that is greater than or less than a predetermined threshold.

At block 342, one or more of the embedded sensors can collect data values. For example, a temperature sensor (e.g., the temperature sensor 130-1 of FIG. 1) can collect a temperature (e.g., the data value) from an environment of which the other device and/or the memory device is located. The sensors embedded in the circuitry of the memory device may collect data intermittently, responsive to a command, and/or continuously, etc. In some embodiments, the data collected by the sensors can be transmitted as signals that represent sensor data (the data value) to the other device via a dedicated output (e.g., the sensor output 118 of FIG. 1).

The sensor output can be directly coupled to the sensors embedded in the memory device. In other embodiments, the sensor data can be transmitted to a register as a signal (e.g., the registers 224 of FIG. 2) that is mapped to each embedded sensor.

For example, at block 344, the memory device can transmit the signals that represent sensor data (e.g., the data value) to a corresponding register. At block 346 the sensor data (e.g., data value) from the embedded sensor can be stored in its corresponding register until it is transmitted to the other device. In some examples, the register can store the sensor data until it is retrieved by an I/O logic (e.g., the I/O logic 207 of FIG. 2). At block 348, the I/O logic can receive the sensor data (e.g., the data value) from the register. The I/O logic can receive the sensor data value responsive to a register read command (e.g., the register read command 222 of FIG. 2) generated by the controller of the memory device. The register read command can be generated responsive to the other device being in an environment, changing an environment, and/or requested by a user and/or host.

At block 350 the signal that represents sensor data (e.g., the data value) can be transmitted to the other device. As mentioned herein, the other device can be coupled to, a part of, or the entirety of a host. The host can conserve resources, time, and power by utilizing sensors that are embedded in the memory device. The signals that represent sensor data collected from the sensors embedded in the memory device can be analyzed by the other device. At block 352, the other device can analyze the signals that represent the sensor data (e.g., the data value) received from the embedded sensors. In some examples, the other device can cause the host coupled to the other device to change an operation based at least in part on the signals that represent sensor data received from the memory device.

Figure 4:
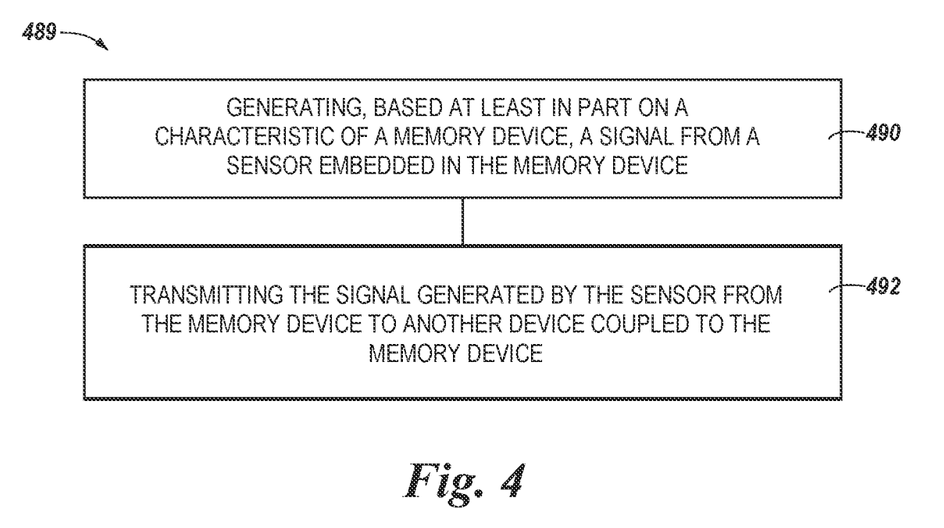
FIG. 4 is a flow diagram representing an example method for memory device sensors in accordance with a number of embodiments of the present disclosure.

FIG. 4 is a flow diagram representing an example method 489 for memory device sensors in accordance with a number of embodiments of the present disclosure. At block 490, the method 489 includes generating, based at least in part on a characteristic of a memory device (e.g., the memory device 112 of FIG. 1), a signal from a sensor (e.g., the sensors 130 of FIG. 1) embedded in the memory device. The sensor can be embedded in the circuitry of the memory device. In some examples, the memory device can be configured to request signals that represent sensor data at intervals using an embedded timer (e.g., the timer 130-2 of FIG. 1) which can include an embedded oscillator (e.g., the oscillator 130-3 of FIG. 1) and/or an embedded counter (e.g., the counter 130-4 of FIG. 1). The memory device can be configured to transmit a request (e.g., a command) to a controller (e.g., the controller 102 of FIG. 1) at predetermined intervals such that signals that represent sensor data from the embedded sensors is generated at continuous intervals. In other embodiments a command is generated responsive to or following a request received by the controller.

For example, in some embodiments, a command can be generated by the controller, responsive to a request from the other device for the signals that represent sensor data from the sensor embedded in the memory device. For example, the sensor may be a temperature sensor embedded in the memory device, the other device may be an IoT device and/or a portion of an IoT device. A component of the IoT device can request temperature sensor data from the embedded sensor. The IoT device can request the sensor data from the controller of the memory device, and, and responsive to the request, the controller can generate the command for the sensor data of the temperature sensor. Embodiments are not limited to a temperature sensor embedded in the memory device.

In other embodiments, the command can be generated by the controller, responsive to a request from the other device for the sensor data from the sensor embedded in the memory device. For example, the sensor may be a motion sensor embedded in the memory device, and the other device may be an IoT device. A component of the IoT device can request motion sensor data from the embedded motion sensor. The IoT device can request the sensor data from the controller of the memory device, and responsive to the request, the controller can generate the command for the sensor data of the motion sensor.

In other embodiments, the command can be generated by the controller, responsive to a request from the other device for the sensor data from the sensor embedded in the memory device. For example, the sensor may be a timer embedded in the memory device, and the other device may be an IoT device. A component of the IoT device can request timer data from the embedded timer. The IoT device can request the timer data from the controller of the memory device, and responsive to the request, the controller can generate the command for the timer data of the timer. The memory device can transmit the timer data to the other device via a dedicated sensor output (e.g., the sensor output 118). The sensor output can be directly coupled to the embedded sensors. Using this method, the embedded sensor data can be directly accessible to the other device (and/or hosts or users).

At block 492, the method 489 includes transmitting the signal generated by the sensor from the memory device to another device coupled to the memory device. In the example above where the sensor is an embedded temperature sensor, the transmitted signal that represents sensor data can be a temperature value indicating an environment of the other device. For example, the temperature value can be a value indicating the temperature of the environment where the other device is physically located.

In the example above where the sensor is an embedded motion sensor, the transmitted signal that represents sensor data can be a value indicating a motion in an environment of the other device. For example, the motion value can be a value indicating motion related to the environment of the other device (e.g., the other device is a vehicle and the motion is detected inside the vehicle). In the example above where the sensor is an embedded timer, the transmitted signal that represents sensor data can be a value indicating a time corresponding to another device. For example, the time value can be a value indicating a time corresponding to the other device (e.g., a timestamp). In some examples, various embedded sensors can generate signals that represent sensor data to be transmitted together. For example, the time value can be paired with a temperature value and/or a motion sensor value.

In another embodiment, the other device can transmit a command to the controller for sensor data from the embedded sensors responsive to a change of environment of the other device. In a different embodiment, the memory device can be configured to detect changes in the environment of the other device and prompt the other device to transmit a request to the controller and/or automatically transmit a command to the embedded sensors. In other words, receiving the command from the controller to transmit the signal that represents sensor data from the sensor can be responsive to the controller detecting a change in an environment of the other device.

For example, the memory device can be coupled to another device in the form of a vehicle. The vehicle may move from a garage location to an outdoor location. The controller of the memory device can be configured to detect this change in environment and transmit a signal that represents sensor data from embedded sensors responsive to the change in environment. The change in environment may change a frequency at which the sensor data is generated, and/or a configured threshold of the sensor data.

For example, embodiments herein can include receiving, by the other device, the data from the sensor embedded in the memory device and initiating an indication that a value included in the data is greater than or less than a predetermined threshold. In some embodiments, the other device may be an IoT device that is configured to take an action (e.g., a preventative measure, initiate an alarm, etc.) responsive to a value generated by an embedded sensor. For example, the other device can receive a temperature value from an embedded sensor via the sensor output and take an action if the temperature value is greater than or less than (e.g., above or below) a predetermined threshold temperature.

Figure 5:
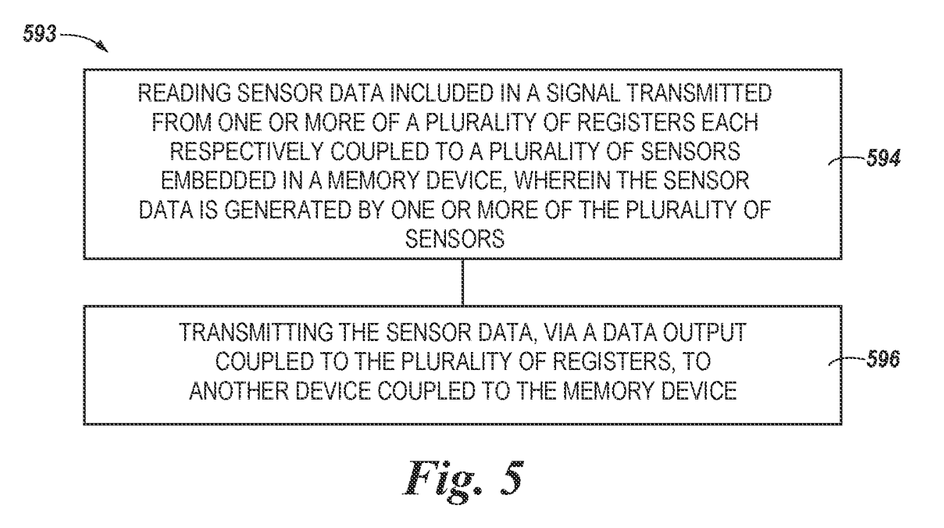
FIG. 5 is a flow diagram representing another example method for memory device sensors in accordance with a number of embodiments of the present disclosure.

FIG. 5 is a flow diagram representing another example method 593 for memory device sensors in accordance with a number of embodiments of the present disclosure. At block 594, the method 593 includes reading sensor data included in a signal from one or more of a plurality of registers (e.g., the registers 224 of FIG. 2) each respectively coupled to a plurality of sensors (e.g., the sensors 230 of FIG. 2) embedded in a memory device (e.g., the memory device 112 of FIG. 1), wherein the sensor data is generated by one or more of the plurality of sensors. In some examples a command (e.g., the register read command 222) to read sensor data from one or more of the plurality of registers can be transmitted by a controller (e.g., the controller 102 of FIG. 1). Responsive to the transmitted command, the signal that represents sensor data can be transmitted via a bus (e.g., the bus 205 of FIG. 2) to another device.

For example, at block 596, the method 593 can include transmitting the sensor data, via a data output (e.g., the data output 216 of FIG. 2) coupled to the plurality of registers, to another device (e.g., the device 220 of FIG. 2) coupled to the memory device. In some embodiments described herein, multiples sensors can be used to transmit a signal that represents sensor data to another device such that is it accessible for a host and/or a user of the other device.

For example, the method 593 can include configuring the controller to transmit a signal that represents sensor data from a first sensor at a predetermined interval initiated by a second sensor, where the first sensor is an embedded temperature sensor (e.g., the temperature sensor 230-1 of FIG. 2) and the second sensor is an embedded timer (e.g., the timer 230-2) and the signal that represents sensor data transmitted at the predetermined interval is a temperature value. The timer can include an oscillator (e.g., the oscillator 230-3 of FIG. 2) and/or a counter (e.g., the counter 230-4 of FIG. 2) to transmit the signal that represents sensor data at the predetermined intervals. The sensor data from the one or more sensors can be written, respectively, to one or more registers.

For example, in the above example, where the transmitted signal that represents sensor data is from an embedded temperature sensor and a timer, the method 593 can include writing the temperature value to a first register (e.g., the register 224-1 of FIG. 2) of the plurality of registers at each of the predetermined intervals and writing a time indicator, from the embedded timer, corresponding to each temperature value to a second register (e.g., register 224-3 and register 224-N of FIG. 2). Such that the embedded sensor data is accessible to the other device (e.g., and/or hosts/users of the other device) the memory device can transmit the signal that represents sensor data from the one or more registers to the other device.

The method 593 can include receiving, by the other device, the temperature value from the first register corresponding to the embedded temperature sensor, and receiving, by the other device, the time value from the second register corresponding to the embedded temperature sensor. Embodiments are not so limited to an embedded temperature sensor.

The method 593 can include configuring the controller to transmit a signal that represents sensor data from a first sensor at predetermined intervals initiated by a second sensor, wherein the first sensor is an embedded motion sensor (e.g., the motion sensor 230-P) and the second sensor is an embedded timer; and the signal that represents sensor data transmitted at the predetermined intervals is a motion value. The motion value is an indication of motion in the other device. The sensor data from the one or more sensors can be written, respectively, to one or more registers.

In the above example, where the transmitted signal that represents sensor data is from an embedded motion sensor, the method 593 can include writing the motion value to a first register (e.g., the register 224-2 of FIG. 2) of the plurality of registers at each of the predetermined intervals, and writing a time value, from the embedded timer, corresponding to each motion value to a second register (e.g., register 224-3 and register 224-N of FIG. 2). Such that the embedded sensor data is accessible to the other device (e.g., and/or hosts/users of the other device) the memory device can transmit the sensor data from the one or more registers to the other device.

The method 593 can include receiving, by the other device, the motion value from the first register corresponding to the embedded motion sensor, and receiving, by the other device, the time value from the second register corresponding to the embedded temperature sensor.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
  generating, based at least in part on a characteristic of a memory device, a signal from a sensor embedded in the memory device;
  receiving a request from another device for the signal generated by the sensor; and
  transmitting, in response to receiving the request, the signal generated by the sensor from the memory device to another device coupled to the memory device wherein the signal is transferred via a sensor output that couples the memory device to the another device.

2. The method of claim 1, further comprising receiving, by a controller coupled to the memory device, a request from the other device for the signal from the sensor embedded in the memory device, wherein the sensor comprises a temperature sensor.

3. The method of claim 2, further comprising transmitting, from the temperature sensor, a value indicating a temperature of an environment of the other device.

4. The method of claim 1, further comprising receiving, by a controller coupled to the memory device, a request from the other device for the signal from the sensor embedded in the memory device, wherein the sensor comprises a motion sensor.

5. The method of claim 4, further comprising transmitting, from the motion sensor, a value indicating a motion in an environment of the other device.

6. The method of claim 1, further comprising receiving, by a controller coupled to the memory device, a request from the other device for the signal from the sensor embedded in the memory device, wherein the sensor is a timer.

7. The method of claim 6, further comprising transmitting, from the timer, a value indicating a time corresponding to the other device.

8. The method of claim 1, further comprising generating a command from a controller coupled to the memory device to transmit the signal from the sensor responsive to the controller detecting a change in an environment of the other device.

9. The method of claim 1, further comprising:
  receiving, by the other device, the signal from the sensor embedded in the memory device; and
  initiating, by the other device, an indication that a value included in the signal is greater than or equal to a threshold.

10. A method, comprising:
  writing sensor data generated by a plurality of sensors embedded in a memory device to a plurality of registers, wherein the plurality of registers are embedded in the memory device;
  reading the sensor data included in a signal transmitted from one or more of the plurality of registers each respectively coupled to the plurality of sensors;
  receiving a request from another device to read the sensor data from the one or more of the plurality of registers;
  transmitting, in response to receiving the request from the another device, the sensor data, via a data output coupled to the plurality of registers, to another device coupled to the memory device.

11. The method of claim 10, further comprising:
  configuring a controller coupled to the memory device to transmit a first signal from a first sensor at a predetermined interval initiated by a second sensor, wherein:

the first sensor is an embedded temperature sensor and the second sensor is an embedded timer; and the first signal represents sensor data transmitted at the predetermined interval includes a temperature value.

12. The method of claim 11, further comprising:

writing the temperature value to a first register of the plurality of registers at each of the predetermined intervals; and writing a time indicator, from the embedded timer, corresponding to each temperature value to a second register.

13. The method of claim 12, further comprising:

receiving, by the other device, the temperature value from the first register corresponding to the embedded temperature sensor; and receiving, by the other device, the time value from the second register corresponding to the embedded temperature sensor.

14. The method of claim 10, further comprising:

configuring a controller coupled to the memory device to transmit a first signal representing sensor data from a first sensor at predetermined intervals initiated by a second sensor, wherein:

the first sensor is an embedded motion sensor and the second sensor is an embedded timer; and the sensor data from the first sensor transmitted at the predetermined intervals includes a motion value.

15. The method of claim 14, further comprising:

writing the motion value to a first register of the plurality of registers at each of the predetermined intervals; and writing a time value, from the embedded timer, corresponding to each motion value to a second register.

16. The method of claim 15, further comprising:

receiving, by the other device, the motion value from the first register corresponding to the embedded motion sensor; and receiving, by the other device, the time value from the second register corresponding to the embedded temperature sensor.

17. A memory device, comprising:

a sensor embedded in the memory device, the sensor configured to collect data related to another device; and a sensor output coupled to the sensor and to the other device to transmit data signal, representing the data collected by the sensor to the other device, wherein the sensor output is dedicated to the sensor embedded in the memory device and wherein the sensor output is configured to transmit the data signal representing the data collected by the sensor in response to receiving a request for the data collected by the sensor from the another device.

18. The memory device of claim 17, wherein the sensor embedded in the memory device includes volatile memory media, and collects data corresponding to an environment of the other device.

19. The memory device of claim 18, wherein the volatile memory media is Dynamic Random Access Memory (DRAM).

20. The memory device of claim 17, the data collected from the sensor includes values related to respective operations of the memory device and the another device.

* * * * *